US009035346B2

(12) United States Patent
Matsunaga et al.

(10) Patent No.: US 9,035,346 B2
(45) Date of Patent: May 19, 2015

(54) LIGHT SOURCE MODULE

(75) Inventors: Takashi Matsunaga, Shizuoka (JP);
Shigeyuki Watanabe, Shizuoka (JP);
Hironori Tsukamoto, Shizuoka (JP);
Ryuho Sato, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 49 days.

(21) Appl. No.: 14/003,158

(22) PCT Filed: Feb. 14, 2012

(86) PCT No.: PCT/JP2012/053419
§ 371 (c)(1),
(2), (4) Date: Sep. 4, 2013

(87) PCT Pub. No.: WO2012/120979
PCT Pub. Date: Sep. 13, 2012

(65) Prior Publication Data
US 2013/0341670 A1    Dec. 26, 2013

(30) Foreign Application Priority Data

Mar. 7, 2011   (JP) ................................. 2011-049102
Mar. 30, 2011  (JP) ................................. 2011-074319

(51) Int. Cl.
*H01L 21/00*     (2006.01)
*H01L 33/64*     (2010.01)
*F21S 8/10*      (2006.01)

(52) U.S. Cl.
CPC ........... *H01L 33/644* (2013.01); *F21S 48/1109* (2013.01); *F21S 48/1159* (2013.01); *F21S 48/328* (2013.01)

(58) Field of Classification Search
USPC ..................... 257/432–433, 98–99
See application file for complete search history.

(56) References Cited

U.S. PATENT DOCUMENTS

| 2006/0141851 | A1  | 6/2006 | Matsui et al. |
| 2009/0237938 | A1* | 9/2009 | Tsutsumi ...................... 362/257 |
| 2011/0063865 | A1* | 3/2011 | Komatsu et al. .............. 362/509 |
| 2011/0140136 | A1* | 6/2011 | Daily et al. ..................... 257/89 |

FOREIGN PATENT DOCUMENTS

| CN | 101078483 A | 11/2007 |
| CN | 101806421 A | 8/2010 |

(Continued)

OTHER PUBLICATIONS

International Search Report for PCT/JP2012/053419, dated May 22, 2012.

(Continued)

*Primary Examiner* — Thanh T Nguyen
(74) *Attorney, Agent, or Firm* — Sughrue Mion, PLLC

(57) ABSTRACT

The light source module includes a circuit board adapted to be placed on a mounting base of a light source holding member, and a power feeding attachment to supply power to a semiconductor light emitting device, the circuit board including a board part on which the semiconductor light emitting device is mounted, and a conductive circuit formed on a surface of the board part and having a pair of terminal parts and a light source connection part to connect the pair of terminal parts and the semiconductor light emitting device, the power feeding attachment including an electrically-insulating portion and an conductive portion partially embedded in the electrically-insulating portion, the power feeding attachment being adapted to be attached to the light source holding member such that the electrically-insulating portion presses at least a portion of the circuit board against the mounting base.

9 Claims, 10 Drawing Sheets

(56) References Cited

FOREIGN PATENT DOCUMENTS

| | | |
|---|---|---|
| JP | 2004-265626 A | 9/2004 |
| JP | 2009-199779 A | 9/2009 |
| JP | 2010-192139 A | 9/2010 |

OTHER PUBLICATIONS

Written Opinion for PCT/JP2012/053419, dated May 22, 2012.
Office Action dated Dec. 9, 2014, issued by the State Intellectual Property Office of the People's Republic of China in counterpart Chinese Application No. 201280012281.1.

* cited by examiner

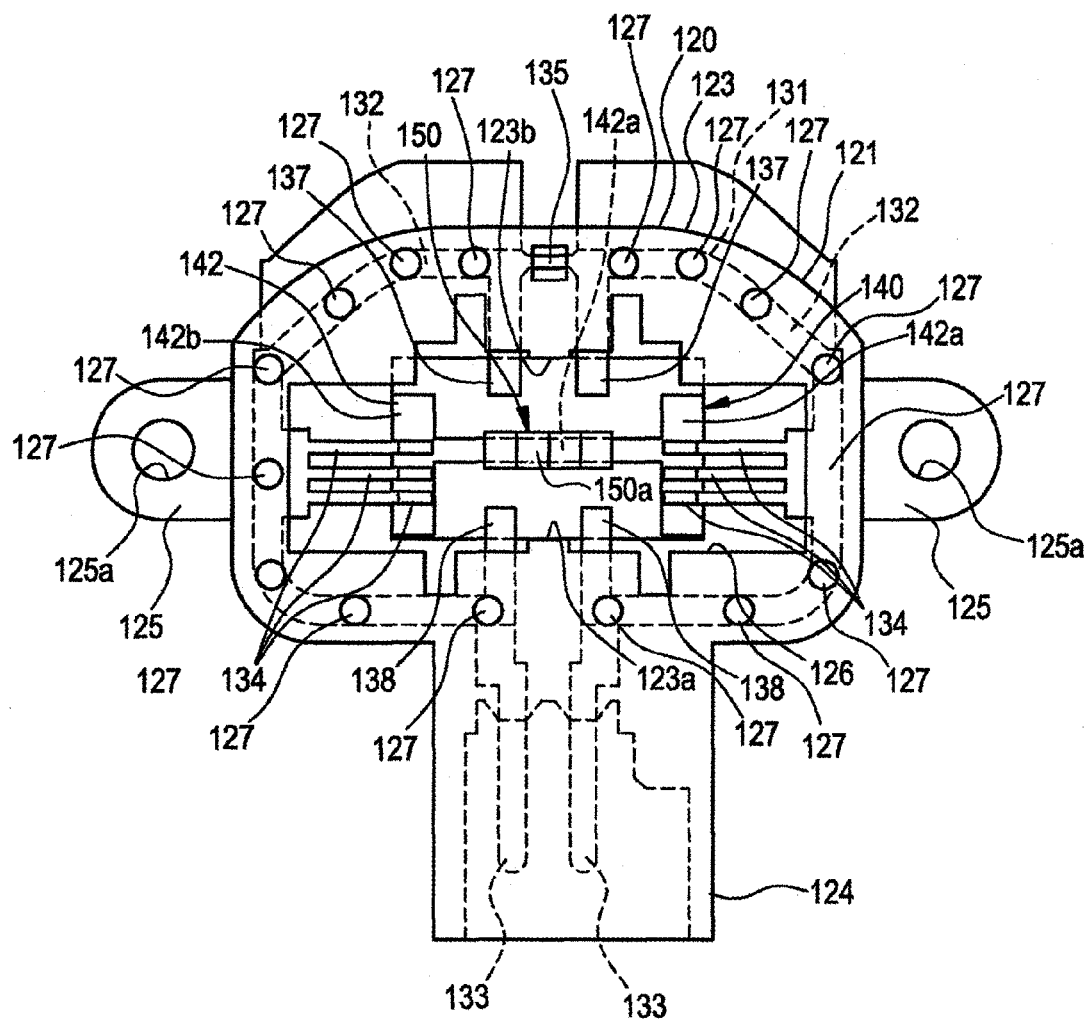

LIGHT SOURCE MODULE

TECHNICAL FIELD

The present invention relates to a light source module and, in particular, to a light source module using a semiconductor light emitting device such as an LED as a light source.

BACKGROUND ART

In recent years, various light source modules using a semiconductor light emitting device such as an LED (Light Emitting Diode) as a light source are being proposed. Such light source modules are being used in, for example, a vehicle lamp for irradiating light emitted from a light source as illumination light. A light source module includes a circuit board placed on a mounting base of a light source holding member and having a surface on which a semiconductor light emitting device is mounted, and a power feeding attachment coupled to a power supply circuit to feeding power to the semiconductor light emitting device. A pair of connecting terminals provided in the power feeding attachment is connected to a pair of power feeding pieces formed on the circuit board respectively (see, e.g., Patent Document 1).

For the semiconductor light emitting device to effectively emit light as a light source of a vehicle lamp, it is necessary to prevent luminance from lowering due to heat. Accordingly, a back surface of the circuit board is brought into firm contact with the mounting base of the light source holding member, so that the heat emitted from the semiconductor light emitting device is released to the light source holding member.

PRIOR ART DOCUMENT

Patent Document

Patent Document 1: JP 2010-192139 A

SUMMARY OF INVENTION

Problem to be Solved by Invention

With regard to light source modules like the one described above, there is a trend toward downsizing of the circuit board to reduce the size of a vehicle lamp. Therefore, the contact area between the mounting base and the back surface of the circuit board is reduced, which raises a problem that it makes it difficult to effectively release heat generated by the semiconductor light emitting device to the light source holding member only by bringing the circuit board into firm contact with the mounting base.

Accordingly, an object of the present invention has to do with solving the problem described above, and is to provide a light source module with improved heat release performance while reducing the size of the light source module.

Means for Solving the Problem

To achieve the above object, according to the present invention, a light source module is provided, the light source module including a circuit board having a surface on which a semiconductor light emitting device is mounted, wherein the circuit board is adapted to be placed on a mounting base of a light source holding member, and a power feeding attachment to supply power to the semiconductor light emitting device. The circuit board includes a board part on which the semiconductor light emitting device is mounted, and a conductive circuit formed on a surface of the board part, the conductive circuit including a pair of terminal parts and a light source connecting part to connect the pair of terminal parts and the semiconductor light emitting device. The power feeding attachment includes an electrically-insulating portion formed of an electrically-insulating material having a higher thermal conductivity than the board part, and a conductive portion formed of a conductive material and embedded in the electrically-insulating portion except a portion thereof. The power feeding attachment is adapted to be attached to the light source holding member such that the electrically-insulating portion presses at least a portion of the circuit board against the mounting base.

In the above described light source module according to the present invention, the conductive portion may include a pressing tab part protruding from the electrically-insulating portion to press an outer peripheral portion of the circuit board such that the circuit board is pressed against the mounting base.

In the above described light source module according to the present invention, a concave portion may be provided in the electrically-insulating portion in a region corresponding to the embedded conductive portion.

In the above described light source module according to the present invention, a portion of the conductive portion embedded in the electrically-insulating portion may be exposed to the outside through the concave portion.

In the above described light source module according to the present invention, the conductive portion may include a pair of power feeding pieces protruding from the electrically-insulating portion to contact the pair of terminal parts, respectively.

Further, to achieve the above object, according to the present invention, a light source module is provided, the light source module including a circuit board having a surface on which a semiconductor light emitting device is mounted, wherein the circuit board is adapted to be placed on a mounting base of a light source holding member, and a power feeding attachment to supply power to the semiconductor light emitting device. The circuit board includes a board part on which the semiconductor light emitting device is mounted, and a conductive circuit formed on the surface of the board part, the conductive circuit including a pair of terminal parts and a light source connecting part to connect the pair of terminal parts and the semiconductor light emitting device. The power feeding attachment includes an electrically-insulating portion formed of an electrically-insulating material, and a conductive portion formed of a conductive material and embedded in the electrically-insulating portion except a portion thereof. The conductive portion includes a pair of power feeding pieces protruding from the electrically-insulating portion to contact the pair of terminal parts, respectively. A concave portion is provided in the electrically-insulating portion in a region corresponding to the embedded conductive portion.

In the above described light source module according to the present invention, a portion of the conductive portion embedded in the electrically-insulating portion may be exposed to the outside through the concave portion.

In the light source module according to the present invention, the conductive portion may include a pressing tab part protruding from the electrically-insulating portion to press an outer peripheral portion of the circuit board such that the circuit board is pressed against the mounting base. The concave portion may be provided at a position to expose a portion of the conductive portion near the pressing tab part to the outside.

In the above described light source module according to the present invention, the electrically-insulating portion may be formed of an electrically-insulating material having a higher thermal conductivity than the board part, and is adapted to be attached to the mounting base such that at least a portion thereof is pressed against the mounting base.

In the above described light source module according to the present invention, the conductive portion may include a pair of power feeding pieces protruding from the electrically-insulating portion to contact the pair of terminal parts, respectively.

Effect of Invention

According to the light source module of the present invention described above, because a portion (e.g., a back surface) of the circuit board is brought into firm contact with the mounting base of the light source holding member by the electrically-insulating portion of the power feeding attachment, heat generated by the semiconductor light emitting device can be effectively released to the light source holding member. In addition, a portion of the electrically-insulating portion formed of an electrically-insulating material having a high thermal conductivity is brought into firm contact with the mounting base, so that the heat generated by the semiconductor light emitting device can be released also from the conductive portion contacting the terminal parts of the circuit board at the power feeding pieces and from the electrically-insulating portion pressing the circuit board against the mounting base. Therefore, even when using a small circuit board whose contact area with the mounting base is small, heat generated by the semiconductor light emitting device can be effectively released to the light source holding member. Accordingly, the light source module can be further downsized without impairing a heat release performance with regard to the heat generated by the semiconductor light emitting device.

Further, according to the light source module of the present invention, the back surface of the circuit board is brought into firm contact with the mounting base of the light source holding member, so that the heat generated from the semiconductor light emitting device is partially transmitted to the conductive portion of the power feeding attachment from the power feeding parts contacting the terminal parts of the circuit board. The concave portion is formed in the electrically-insulating portion in a region corresponding to the conductive portion, so that the thickness is small in the region corresponding to the conductive portion, whereby the heat is effectively dissipated in the air. Although another part of the heat generated from the semiconductor light emitting device is transmitted also to the electrically-insulating portion, because the concave portion is formed, the surface area of the electrically-insulating portion itself is increased as compared with a case in which there is no concave portion, whereby the efficiency of releasing the transmitted heat into the air is improved.

BRIEF DESCRIPTION OF DRAWINGS

FIG. 10 is a plan view of a light source module according to a modification of the third embodiment of the present invention.

EMBODIMENTS OF THE INVENTION

First Embodiment

Hereinafter, a vehicle lamp 1 including a light source module 100 according to a first embodiment of the present invention will be described with reference to the accompanying drawings. In the following description, "front and rear" represents a lamp front-rear direction of the vehicle lamp 1, that is, a direction almost the same as a front-rear direction of a vehicle on which the vehicle lamp 1 is mounted. Further, "left and right" represents a lamp lateral direction of the vehicle lamp 1, that is, a width direction of a vehicle.

Figure 1:
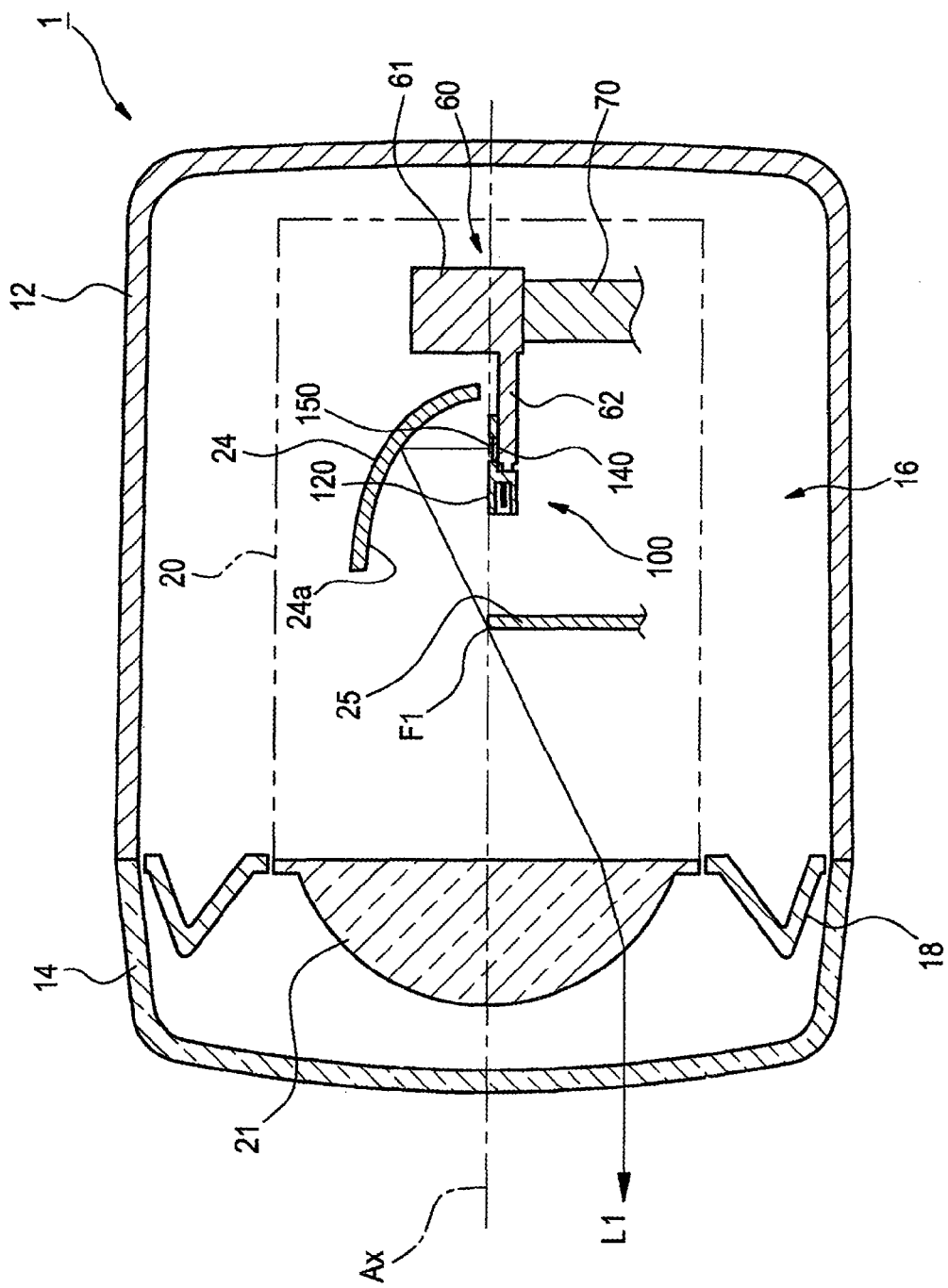
FIG. 1 is a schematic longitudinal sectional view showing a vehicle lamp 1 including a light source module according to a first embodiment of the present invention.

FIG. 1 is a schematic longitudinal sectional view showing the vehicle lamp 1 including the light source module 100 according to the first embodiment of the present invention. The vehicle lamp 1 is a vehicle headlamp attached to, for example, a front end portion of a vehicle. As shown in FIG. 1, the vehicle lamp 1 is configured by including a lamp body 12, a transparent cover 14 attached to cover an opening provided at a front end of the lamp body 12, and a lamp unit 20 having a configuration to form a low beam light distribution pattern.

Among these structures, the lamp unit 20 is a so-called projector-type lamp unit. The lamp unit 20 includes a projection lens 21, a reflector 24, a shade 25, the light source module 100, a light source holding member 60, and a support member 70, and is fixed inside a lamp chamber 16 formed by the lamp body 12 and the translucent cover 14. An extension 18 is disposed between the lamp unit 20 and the lamp body 12 so as to cover the gap between the lamp body 12 and the lamp unit 20, when viewed from the front of the lamp.

The projection lens 21 is a plano-convex lens having a spherical convex front surface and a flat rear surface, and is disposed such that a lens optical axis thereof substantially matches a lamp optical axis Ax extending in the front-rear direction of a vehicle. The light source module 100 is arranged on a rear side of the projection lens 21, and is positioned and fixed to the light source holding member 60 that is attached to the support member 70. The light source module 100 includes a light emitting diode 150, which is a light source of the vehicle lamp 1, and upwardly irradiates light from the light emitting diode 150.

The reflector 24 is a substantially dome-shaped member disposed above the light source module 100, and a concave surface side thereof is configured as a reflecting surface 24a. The reflecting surface 24a is formed in a substantially elliptical spherical shape whose center axis is the lamp optical axis Ax. Specifically, the reflecting surface 24a is designed such that a shape of a cross-section including the lamp optical axis Ax is substantially a portion of an ellipse, and such that eccentricity thereof is gradually increased from a vertical section toward a horizontal section. A first focal point of the reflecting surface 24a is substantially at a position where the light emitting diode 150 of the light source module 100 is provided, and a second focal point is substantially at a rear focal point (a position denoted by "F1" in FIG. 1) of the projection lens 21.

Accordingly, light emitted from the light emitting diode 150 of the light source module 100 is forwardly reflected by the reflecting surface 24a of the reflector 24 to converge toward the lamp optical axis Ax, and is projected forward through the projection lens 21, as a light distribution pattern having an inverted image on a focal plane including a rear focal point (F1) of the projection lens 21 (an example of light ray trajectory is denoted by "L1" in FIG. 1). The shade 25 is configured to form a predetermined cutoff line of the light distribution pattern formed by the light reflected by the reflector 24 by blocking a part of the reflected light, and is disposed between the projection lens 21 and the light source module 100.

Figure 2:
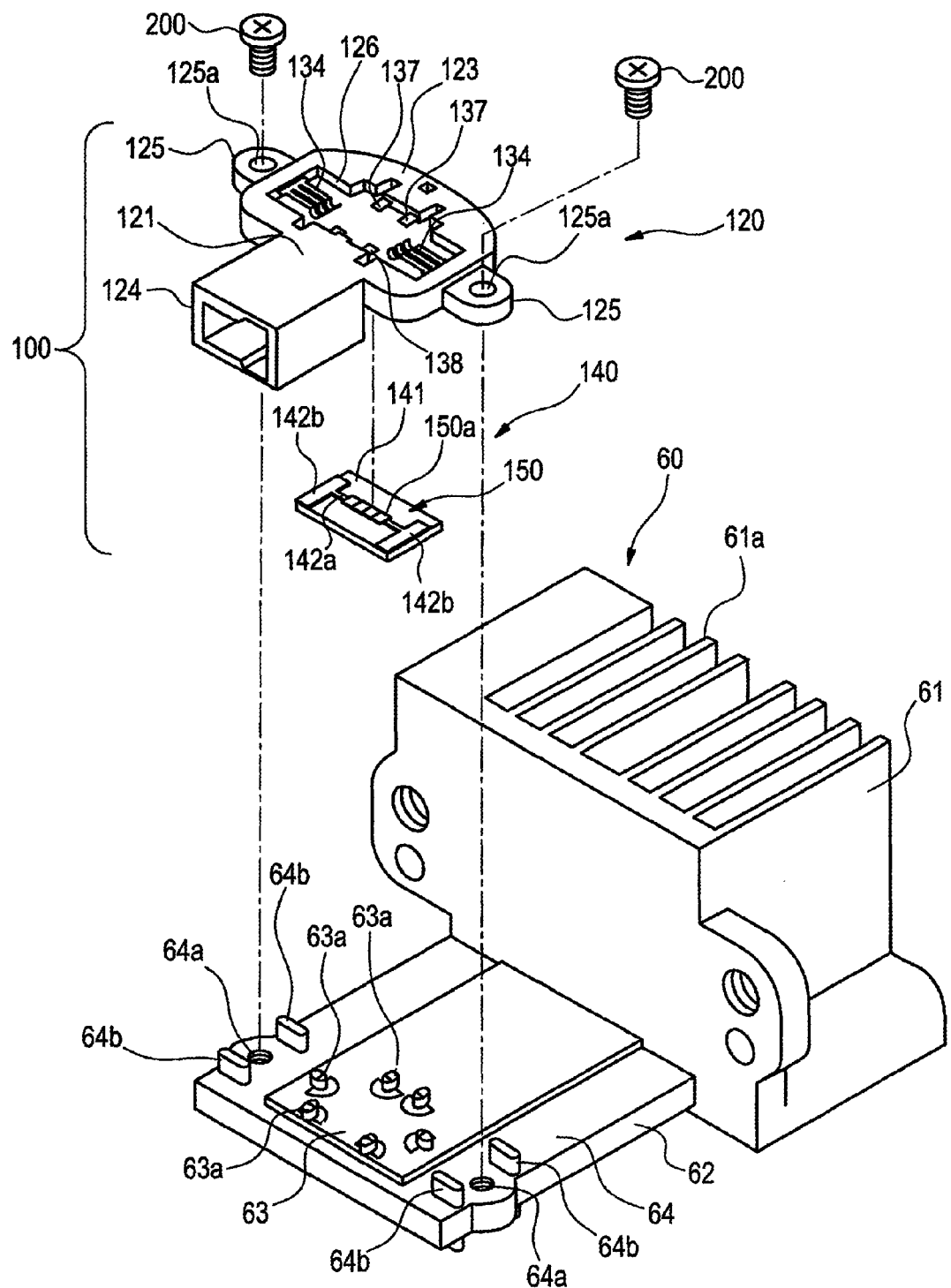
FIG. 2 is an exploded perspective view of a light source holding member and the light source module.
Figure 3:
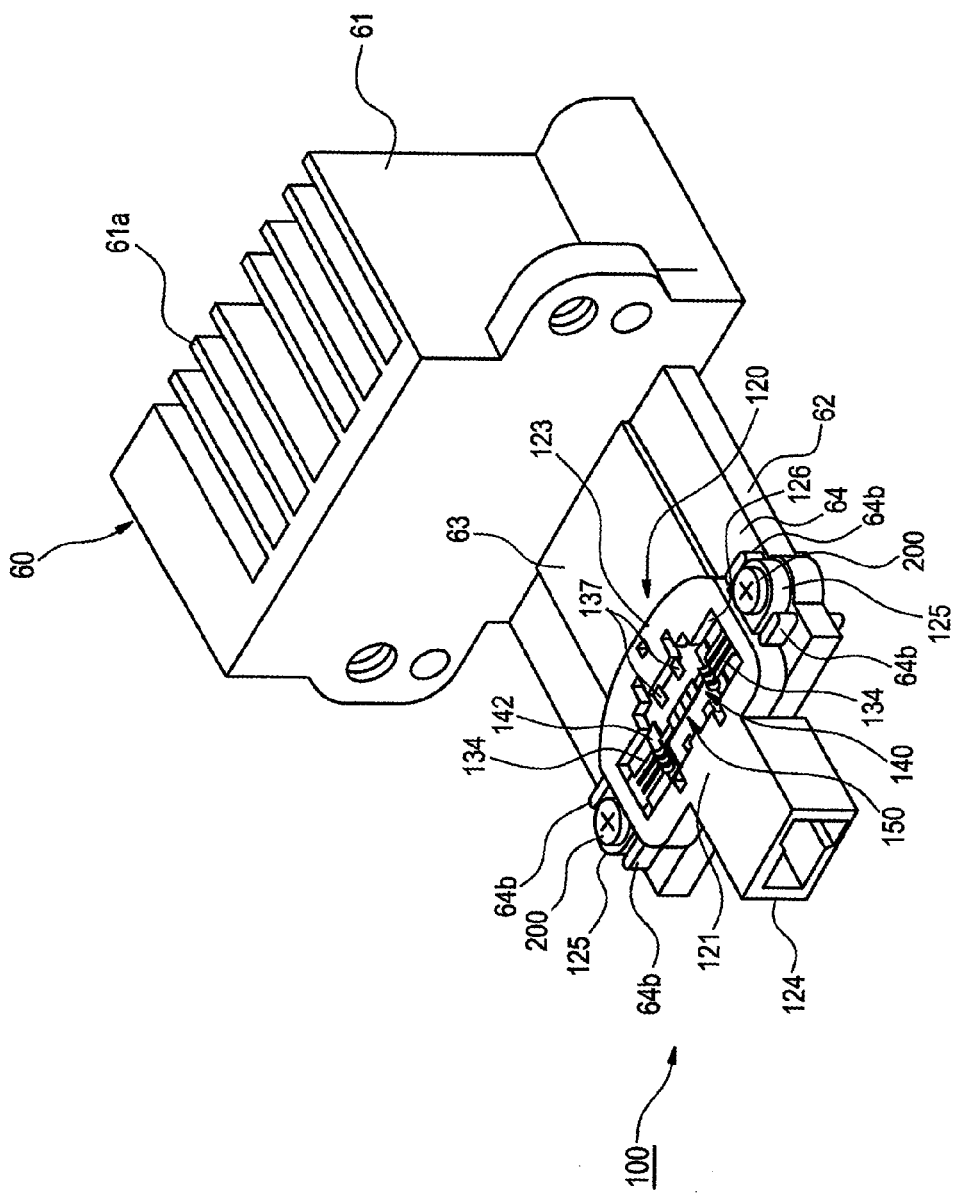
FIG. 3 is a perspective view showing a state in which the light source module is attached to the light source holding member.
Figure 4:
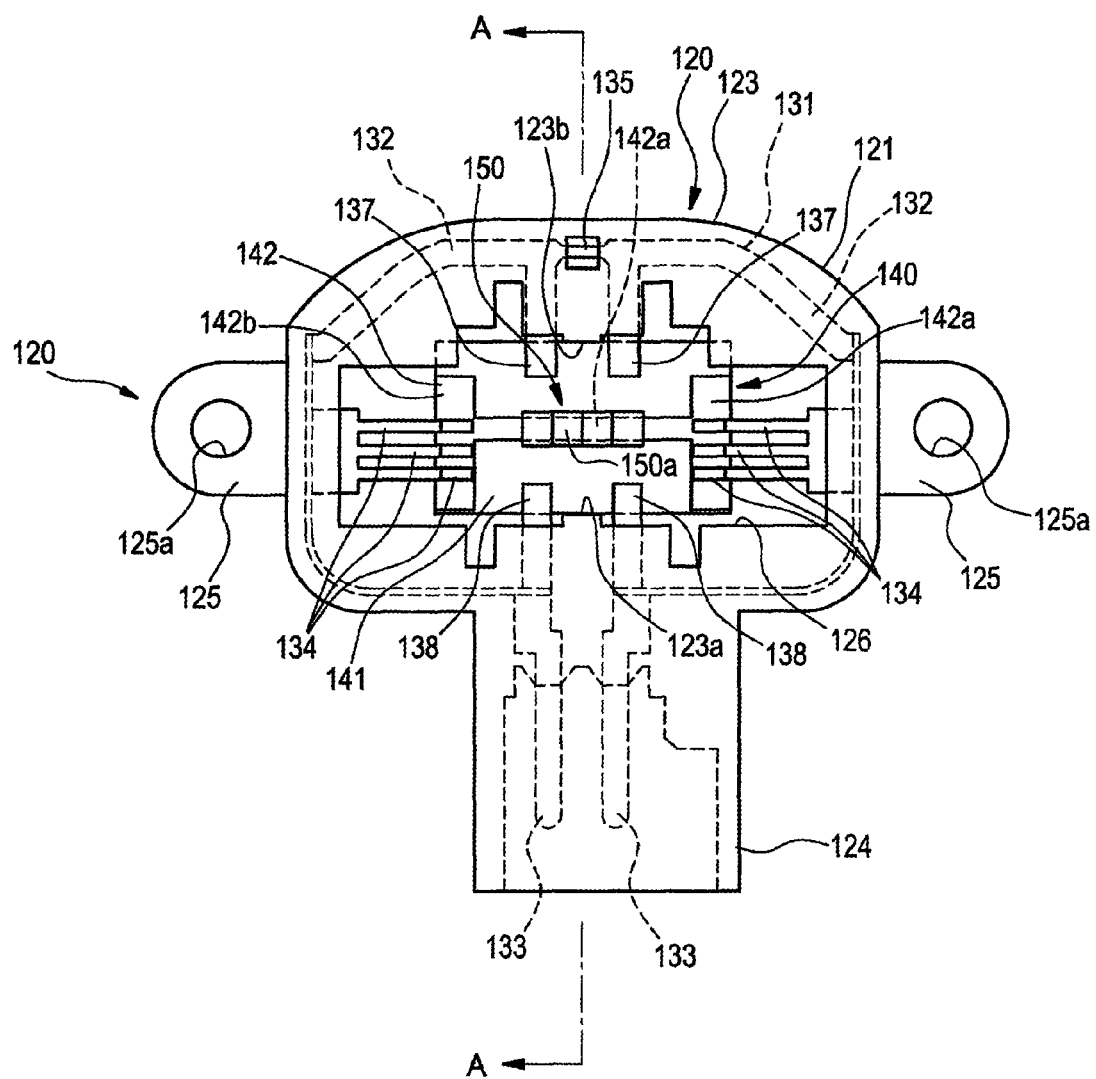
FIG. 4 is a plan view of the light source module.
Figure 5:
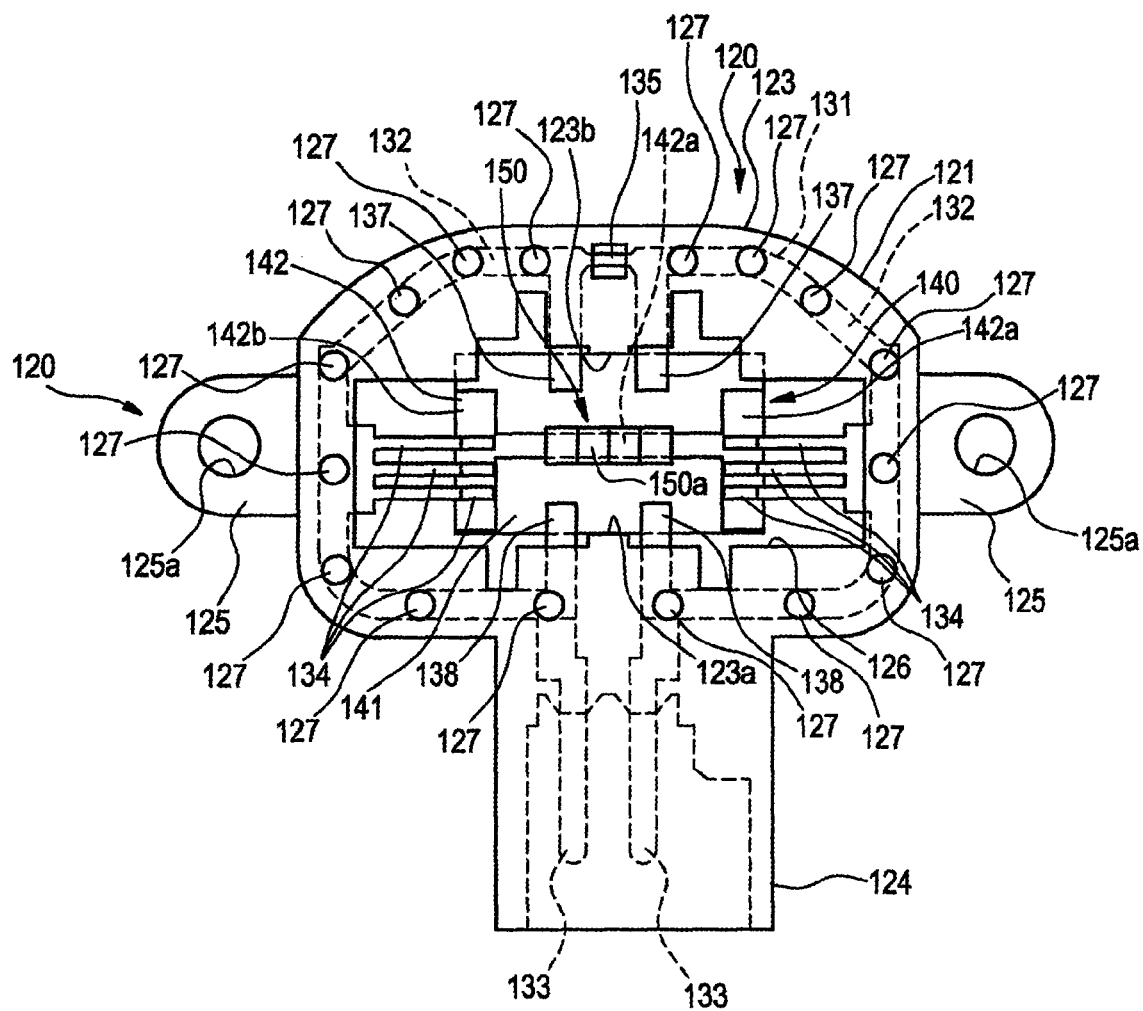
FIG. 5 is a sectional view of the light source module taken along the line A-A shown in FIG. 4.

FIG. 2 is an exploded perspective view of the light source holding member 60 and the light source module 100. FIG. 3 is a perspective view showing a state in which the light source module 100 is attached to the light source holding member 60. FIG. 4 is a plan view of the light source module 100. FIG. 5 is a sectional view of the light source module 100 taken along the line A-A shown in FIG. 4.

The light source module 100 includes a power feeding attachment 120 and a circuit board 140. The power feeding attachment 120 supplies power to the light emitting diode 150 on the circuit board 140. The light source holding member 60 serves as a heat dissipating member that dissipates heat generated from the circuit board 140 of the light source module 100 and the light emitting diode 150 mounted on the circuit board 140.

The light source holding member 60 includes a heat dissipating portion 61 having a plurality of rearwardly protruding heat dissipating fins 61a, and a substantially flat-plate base part 62 protruding forward from the heat dissipating portion 61. The power feeding attachment 120 and the circuit board 140 are disposed on an upper surface of the base part 62.

The base part 62 is provided as a single piece together with the heat dissipating portion 61 so as to protrude forward from the heat dissipating portion 61 of the light source holding member 60. In this example, the base part 62 is a substantially rectangular flat plate protruding from the front surface of the heat dissipating portion 61, and includes an attaching surface portion 64 provided on both left and right side portions and a front end portion of an upper surface thereof and a board mounting portion 63 provided by raising a portion of the upper surface other than the attaching surface portion 64 a step higher.

As shown in FIG. 2 and FIG. 3, the light source module 100 is attached to the front end side of the base part 62. Specifically, the light source module 100 can be fixed to the base part 62 by placing the circuit board 140 on the board mounting portion 63 and then attaching the power feeding attachment 120 to the attaching surface portion 64 so as to press the circuit board 140 against the board mounting portion 63 from above.

On a front-side surface of the board mounting portion 63, a plurality of positioning pins 63a for positioning the circuit board 140 on the board mounting portion 63 is provided so as to protrude upward when the circuit board 140 of the light source module 100 is placed on the board mounting portion 63. Further, screw holes 64a are formed on both left and right sides of the attaching surface portion 64 and mounting screws 200 for fixing the power feeding attachment 120 of the light source module 100 are screwed to the screw holes 64a. Further, ribs 64b are provided in front and back of the screw holes 64a of the attaching surface portion 64 to position attaching tab portions 125 of the power feeding attachment 120 on the attaching surface portion 64 when the power feeding attachment 120 is attached to the attaching surface portion 64.

The circuit board 140 includes a non-conductive board part 141 and a conductive circuit 142 provided on the board part 141, and a plurality of light emitting diodes 150 (four in this example) are mounted on the central portion of the circuit board. These light emitting diodes 150 are examples of the semiconductor light emitting device in the present invention. The board part 141 is formed of, for example, an epoxy resin material. In this case, the conductive circuit 142 is formed of, for example, aluminum. Alternatively, the board part 141 may be a silicone board and, in this case, the conductive circuit 142 may be formed, for example, by copper plating on the silicone board.

As shown in FIG. 4, the conductive circuit 142 includes, for example, a light source connecting portion 142a and terminal portions 142b. The light source connecting portion 142a is electrically connected to the respective light emitting diodes 150 that are mounted on an upper surface thereof. The terminal portions 142b are circuit patterns and are continuous with the light source connecting portion 142a, and are provided in a pair at both left and right sides on the board part 141 with the light source connecting portion 142a interposed therebetween.

The power feeding attachment 120 includes a resin molded portion (electrically-insulating portion) 121 formed of a non-conductive resin material and a conductive portion 131 formed of a conductive material such as metal (see FIG. 2 to FIG. 4). The conductive portion 131 is embedded in the resin molded portion 121 except a portion thereof. In this example, the resin material used for forming the resin molded portion 121 is a material having higher thermal conductivity, for example, thermal conductivity of 5.0 to 10.0 [W/m·K], than a resin material (thermal conductivity of 1.0 [W/m·K] or less) used in a conventional resin molded portion. More specifically, as the material forming the resin molded portion 121, for example, nylon resin is preferably used. The power feeding attachment 120 is formed by, for example, so-called insert molding in which the conductive portion 131 is placed at a given position inside the cavity of a molding die and molten resin filling the cavity is cured. In this way, the conductive portion 131 and the resin molded portion 121 are integrally molded.

The resin molded portion 121 is an example of the electrically-insulating portion according to the present invention, and includes a frame portion 123, a connector case portion 124 protruding forward from the frame portion 123, and attaching tab portions 125 protruding respectively in left and right directions from the frame portion 123. An opening 126 for disposing the circuit board 140 therein is provided on an inner side of the frame portion 123.

As shown in FIG. 4 and FIG. 5, a positioning protrusion 123a protruding rearward is provided on the front inner surface of the opening 126 at the central portion in the left-right direction. A positioning protrusion 123b protruding forward is provided on the rear inner surface of the opening 126 at the central portion of a left-right direction. The circuit board 140 is positioned inside the opening 126 of the frame portion 123 by these positioning protrusions 123a, 123b when the power feeding attachment 120 and the circuit board 140 are attached to the base part 62.

The connector case portion 124 has an outer form of a substantially rectangular tube-shape, and a concave space is formed inside an opening provided at a front side thereof. In an interior of the connector case portion 124, the connector terminal parts 133 of the conductive portion 131 to be described later protrude forward from a rear wall surface.

Each of the attaching tab portions 125 is formed with, for example as shown in FIG. 2 and FIG. 3, a screw insertion hole 125a penetrating in a vertical direction, and an upper surface thereof is lower than an upper surface of the frame portion 123. The power feeding attachment 120 can be attached to the base part 62 by placing the power feeding attachment 120 on the base part 62 and screwing the mounting screws 200 such that two screw insertion holes 125a provided in the attaching tab portions 125 corresponds to two screw holes 64a of the base part 62.

The conductive portion 131 includes a substantially annular base body portion 132 entirely embedded in the resin molded portion 121, connector terminal parts 133 protruding forward from a front-side end portion (front end portion) of the base body portion 132, power feeding pieces 134 protruding inward from both left and right sides of the base body portion 132, a connecting portion 135 connecting rear-side end portions (rear end portions) of the base body portion 132, two pressing tab parts 137 protruding forward from a rear end portion of the base body part 132, and two pressing tab parts 138 protruding rearward from a front end portion of the base body part 132. The connecting portion is cut when the light source module 100 is attached to the base part 62 of the light source holding member 60 for use. In this way, the handling of the conductive portion 131 is improved.

For each connector terminal part 133, a portion near the base body part 132 is embedded in the resin molded portion 121, and a portion (distal end portion) away from the base body part 132 is exposed from the resin molded portion 121 and protrudes forward from the rear wall surface of the interior of the connector case portion 124. When a connector (not shown) is inserted into the connector case portion 124, the connector terminal parts 133 are electrically connected to terminals on the side of the connector.

Each of the pressing tab parts 137, 138 is a plate-like member extending from the base body part 132, and contacts an outer peripheral portion of the circuit board 140 on which the conductive circuit 142 is not provided, thereby pressing the circuit board 140 toward the base part 62. The pressing tab parts 137, 138 may be formed of the same material as the conductive portion 131, however, it is preferable that the pressing tab parts 137, 138 are formed of a material having a high thermal conductivity.

In this way, the light source module 100 according to the present embodiment is configured such that the circuit board 140 is pressed against the base part 62 of the light source holding member 60 by the resin molded portion 121 of the power feeding attachment 120 and the pressing tab parts 137, 138 when the power feeding attachment 120 is attached to the base part 62, so that the bottom surface of the circuit board 140 and the upper surface of the base part 62 are brought into firm contact with each other. Accordingly, heat generated from the light emitting diodes 150 and transmitted to the circuit board 140 can be released efficiently to the light source holding member 60.

Further, because the resin molded portion 121 is formed of an electrically-insulating material having a higher thermal conductivity than the board part 141 of the circuit board 140, the heat that is generated from the light emitting diodes 150 and transmitted to the circuit board 140 can be released efficiently also through the portion of the resin molded portion 121 contacting the circuit board 140. Further, the heat generated by the light emitting diodes 150 can be released also through the power feeding pieces 134 contacting the terminal parts 142b of the circuit board 140.

Further, in a case in which the pressing tab parts 137, 138 are formed of an electrically-insulating material, unlike the rest of the conductive portion 131, the pressing tab parts 137, 138 may be arranged to contact the conductive circuit 142 so as to more effectively transmit heat generated by the light emitting diodes 150 to the pressing tab parts 137, 138. While the pressing tab parts 137, 138 are provided two each in this example, the number and a position of the pressing tab parts are not limited to these configurations.

Figure 6:
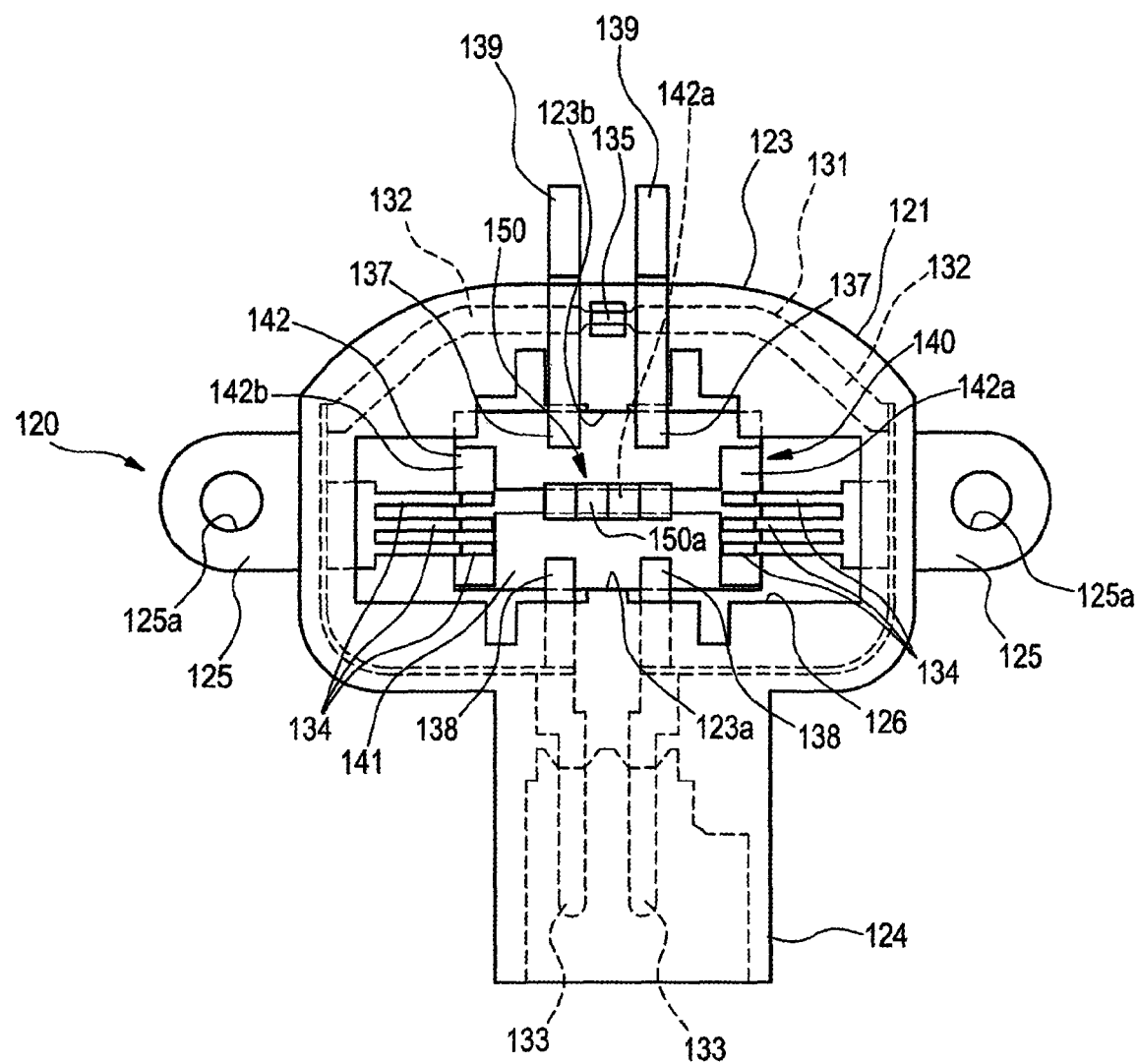
FIG. 6 is a plan view of a light source module according to a modification of the first embodiment of the present invention.

The surface of the resin molded portion 121 may be provided with, for example as shown in FIG. 6, a plurality of concave portions 127 in a region corresponding to the conductive portion 131 embedded therein. FIG. 6 is a plan view of a light source module 100A according to a modification of the first embodiment. A configuration of the light source module 100A of this example is different only partially from the foregoing light source module 100. Therefore, an exploded perspective view of the light source module 100A or a view showing a state in which the light source module 10A is attached to the light source holding member 60 is omitted, and the same configurations as in the light source modules 100 are denoted by the same reference numerals and a description thereof is omitted.

Heat generated from the light emitting diodes 150 is transmitted to the conductive portion 131 through the power feeding parts 134 contacting the terminal portions 142b of the circuit board 140. Here, the concave portions 127 are provided on the surface of the resin molded portion 121 in a region corresponding to the conductive portion 131, so that the thickness of the resin molded portion 121 near the conductive portion 131 is small, whereby the heat transmitted to the conductive portion 131 can be efficiently released to the air. Further, by providing the concave portion 127, the surface area of the resin molded portion 121 itself is increased as compared with a case in which there is no concave portion 127, whereby the efficiency of releasing the heat transmitted to the resin molded portion 121 to the air is improved.

The concave portion 127 may be formed as a hole penetrating from the surface of the resin molded portion 121 to the conductive portion 131 such that a portion of the conductive portion 131 is exposed to the outside. By forming the concave portion 127 as a through hole, the heat transmitted to the conductive portion 131 can be further efficiently released to the air.

Further, a portion of the conductive portion 131 near the pressing tab parts 137, 138 may be exposed to the outside through the concave portion 127. In this way, the heat transmitted from the pressing tab parts 137, 138 pressing the outer peripheral portion of the circuit board 140 to the conductive portion 131 can be effectively released to the air.

The concave portions 127 may be formed independently along the conductive portion 131 as shown in the drawing or a single concave portion 127 having a shape extending along the conductive portion 131 may be formed.

Second Embodiment

Figure 7:
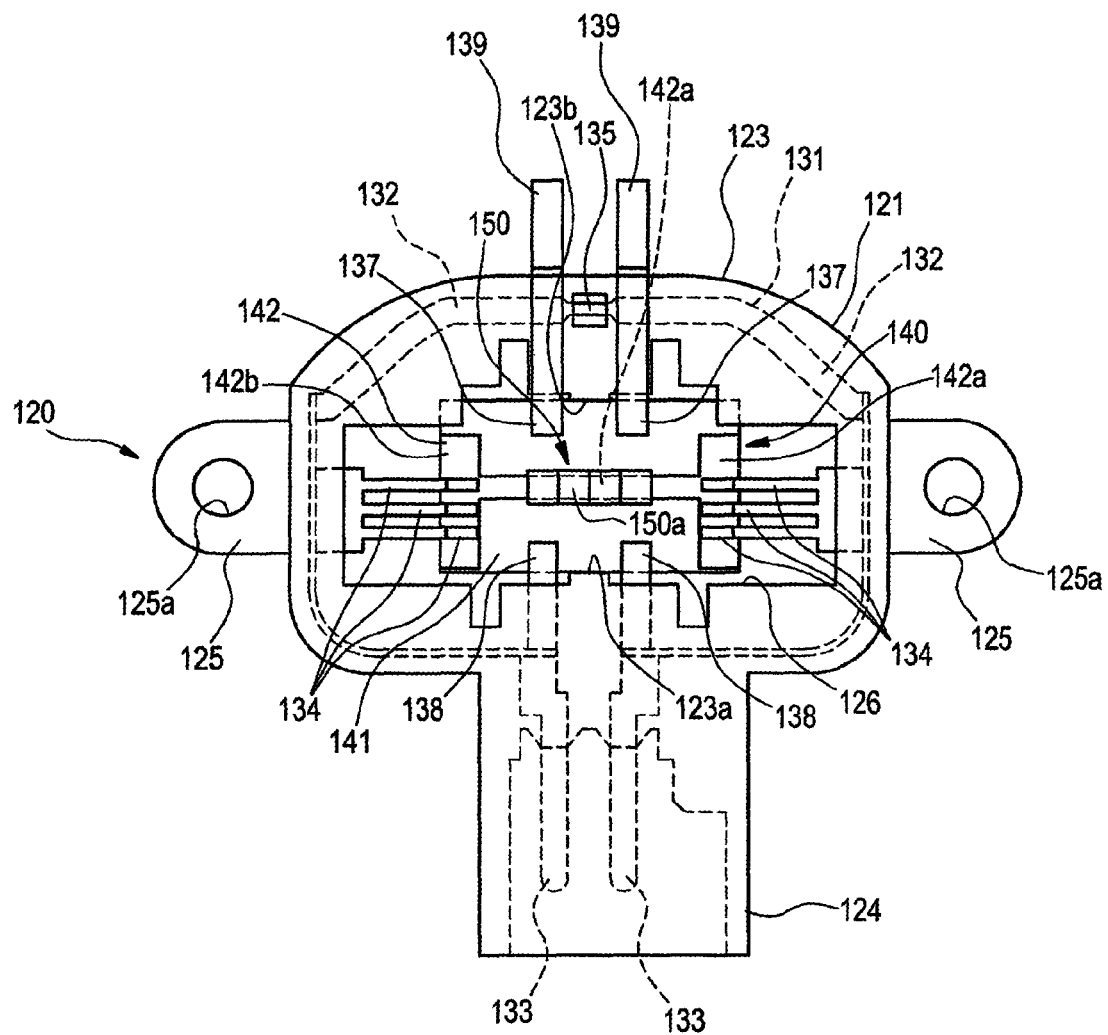
FIG. 7 is a plan view of a light source module according to a second embodiment of the present invention.

FIG. 7 is a plan view of a light source module 101 according to a second embodiment of the present invention. A configuration of the light source module 101 of this example is different only partially from the light source modules 100. Therefore, an exploded perspective view of the light source module 101 or a view showing a state in which the light source module 101 is attached to the light source holding member 60 is omitted, and the same configurations as in the light source module 100 are denoted by the same reference numerals and a description thereof is omitted.

According to the light source module 101 of this example, the pressing tab part 137 is provided as a separate piece from the conductive portion 131, and extends to the rear of the resin molded portion 121 so as to detour an outer surface of the resin molded portion 121. With this light source module 101, the extended portion 139 of the pressing tab part 137 extending to the rear of the resin molded portion 121 contacts the surface of the board mounting portion 63 of the light source holding member 60 when the light source module 101 is attached to the light source holding member 60.

With this configuration, the light source module 101 can more effectively release heat generated by the light emitting diodes 150 through the pressing tab part 137. Further, with the light source module 101 of this example, the pressing tab part 137 is provided separately from the conductive portion 131, so that it is possible to use a material having a higher thermal conductivity than the conductive portion 131.

Figure 8:
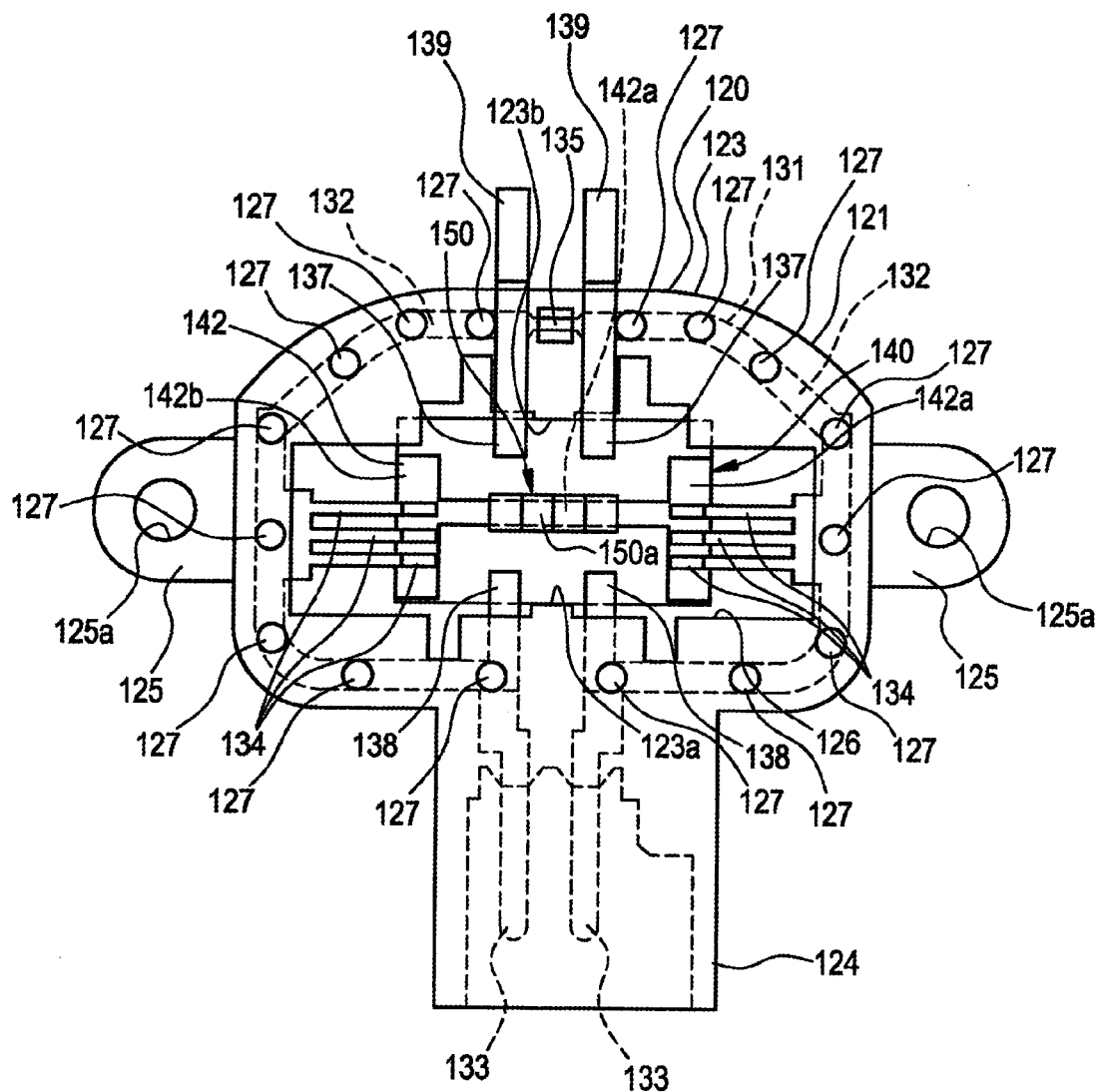
FIG. 8 is a plan view of a light source module according to a modification of the second embodiment of the present invention.

Also with the light source module 101 according to the second embodiment, the concave portions 127 may be formed in the surface of the resin molded portion 121 in a region of corresponding to the conductive portion 131, as shown in FIG. 8. This makes it possible to efficiently release the heat transmitted to the conductive portion 131 to the air.

Third Embodiment

Figure 9:
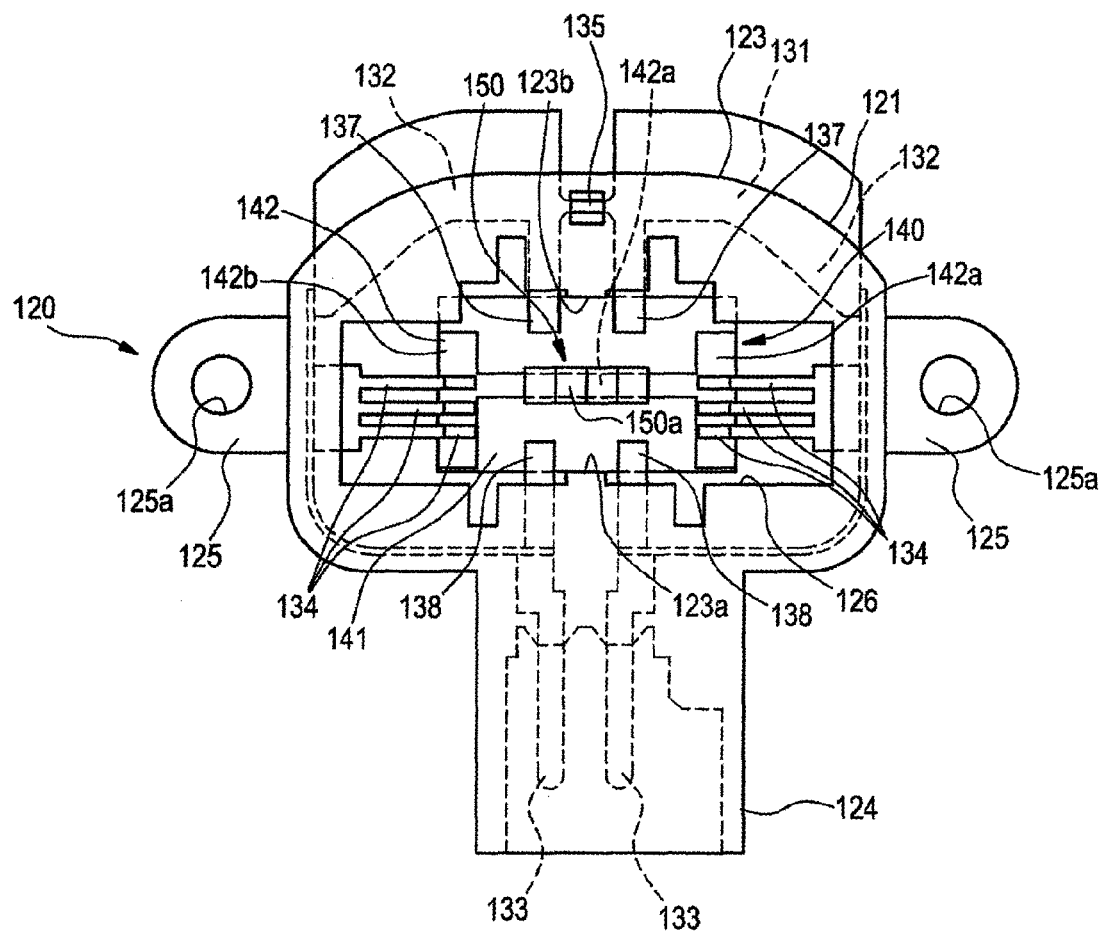
FIG. 9 is a plan view of a light source module according to a third embodiment of the present invention.

FIG. 9 is a plan view of a light source module 102 according to a third embodiment of the present invention. A configuration of the light source module 102 of this example is different only partially from the light source modules 100, 101. Therefore, an exploded perspective view of the light source module 102 or a view showing a state in which the light source module 102 is attached to the light source holding member 60 is omitted, and the same configurations as in the light source modules 100, 101 are denoted by the same reference numerals and a description thereof is omitted.

According to the light source module 102 of this example, a portion of the base body part 132 of the conductive portion 131 extends outward (rearward) from the resin molded portion 121. This extended portion does not contact the light source holding member 60 when the light source module 102 is attached to the light source holding member 60. However, the extended portion may be brought into contact with the light source holding member 60 by forming the light source holding member 60 using a material having an electrically-insulating property.

With this configuration, the light source module 102 can release heat generated by the light emitting diodes 150 into the air through a portion of the base body part 132 extending outward from the resin molded portion 121, and therefore, the heat dissipation efficiency is further improved.

Also in the third embodiment, the concave portions 127 may be formed in the surface of the resin molded portion 121 in a region of corresponding to the conductive portion 131, as shown in FIG. 10. This makes it possible to effectively release the heat transmitted to the conductive portion 131 into the air.

While the present invention has been described in detail with reference to certain embodiments thereof, it is apparent to those skilled in the art that various changes and modifications can be made therein without departing a spirit and scope of the present invention. This application is based on Japanese Patent Application No. 2011-49102 filed on Mar. 7, 2011 and Japanese Patent Application No. 2011-74319 filed on Mar. 30, 2011, the contents of which are incorporated herein by reference.

INDUSTRIAL APPLICABILITY

According to the light source module of the present invention described above, because a portion (e.g., a back surface) of the circuit board is brought into firm contact with the mounting base of the light source holding member by the electrically-insulating portion of the power feeding attachment, heat generated by the semiconductor light emitting device can be effectively released to the light source holding member. In addition, by bringing a portion of the electrically-insulating portion formed of an electrically-insulating material having a high thermal conductivity into firm contact with the mounting base, the heat generated by the semiconductor light emitting device can be released also from the conductive portion contacting the terminal parts of the circuit board at the power feeding pieces and from the electrically-insulating portion that presses the circuit board against the mounting base. Therefore, even when using a small circuit board whose contact area with the mounting base is small, heat generated by the semiconductor light emitting device can be effectively released to the light source holding member. Accordingly, the light source module can be further downsized without impairing a heat release performance with regard to the heat generated by the semiconductor light emitting device.

EXPLANATION OF REFERENCE SIGNS

1 . . . vehicle lamp, 12 . . . lamp body, 14 . . . transparent cover, 16 . . . lamp chamber, 18 . . . extension, 20 . . . light-converging lamp unit, 21 . . . projection lens, 24 . . . reflector, 25 . . . shade, 60 . . . light source holding member, 61 . . . heat dissipating portion, 61a . . . heat dissipating fin, 62 . . . mounting base, 63 . . . board mounting portion, 63a . . . protrusion pin, 64 . . . attaching surface portion, 64a . . . screw hole, 64b . . . positioning ridge, 70 . . . support member, 100, 101, 102 . . . light source module, 120 . . . power feeding attachment, 121 . . . resin molded portion (electrically-insulating portion), 123 . . . frame portion, 123a, 123b . . . positioning protrusion, 123c . . . positioning portion, 124 . . . connector case portion, 125 . . . attaching piece portion, 125a . . . screw insertion hole, 126 . . . opening, 127 . . . concave portion, 131 . . . conductive portion, 132 . . . base body part, 133 . . . connector terminal part, 134 . . . power feeding piece, 135 . . . connection part, 136 . . . light source holding member, 137, 138 . . . pressing tab part, 139 . . . extended portion, 140 . . . circuit board, 141 . . . board part, 142 . . . conductive circuit, 142a . . . light source connecting portion, 142b . . . terminal portion, 150 . . . light emitting diode (semiconductor light emitting device), 150a . . . light emitting surface, 200 . . . mounting hole, ax . . . lamp optical axis

The invention claimed is:
1. A light source module comprising:
a circuit board having a surface on which a semiconductor light emitting device is mounted, wherein the circuit board is adapted to be placed on a mounting base of a light source holding member, and
a power feeding attachment to supply power to the semiconductor light emitting device,
wherein the circuit board comprises:
a board part on which the semiconductor light emitting device is mounted; and
a conductive circuit formed on the surface of the board part, the conductive circuit including a pair of terminal parts and a light source connecting part to connect the pair of terminal parts and the semiconductor light emitting device, wherein the power feeding attachment comprises:
an electrically-insulating portion formed of an electrically-insulating material having a thermal conductivity of 5.0 to 10.0 W/m·K; and
a conductive portion formed of a conductive material and embedded in the electrically-insulating portion except a portion thereof, and
wherein the power feeding attachment is adapted to be attached to the light source holding member such that the electrically-insulating portion presses at least a portion of the circuit board against the mounting base.

2. The light source module according to claim 1, wherein the conductive portion comprises a pressing tab part protruding from the electrically-insulating portion to press an outer peripheral portion of the circuit board such that the circuit board is pressed against the mounting base.

3. The light source module according to claim 1, wherein a concave portion is provided in the electrically-insulating portion in a region corresponding to the embedded conductive portion.

4. The light source module according to claim 3, wherein a portion of the conductive portion embedded in the electrically-insulating portion is exposed to the outside through the concave portion.

5. The light source module according to claim 1, wherein the conductive portion comprises a pair of power feeding pieces protruding from the electrically-insulating portion to contact the pair of terminal parts, respectively.

6. A light source module comprising:
a circuit board having a surface on which a semiconductor light emitting device is mounted, wherein the circuit board is adapted to be placed on a mounting base of a light source holding member, and
a power feeding attachment to supply power to the semiconductor light emitting device,
wherein the circuit board comprises:
a board part on which the semiconductor light emitting device is mounted; and
a conductive circuit formed on the surface of the board part, the conductive circuit including a pair of terminal parts and a light source connecting part to connect the pair of terminal parts and the semiconductor light emitting device, wherein the power feeding attachment comprises:
an electrically-insulating portion formed of an electrically-insulating material; and
a conductive portion formed of a conductive material and embedded in the electrically-insulating portion except a portion thereof,
wherein the conductive portion comprises a pair of power feeding pieces protruding from the electrically-insulating portion to contact the pair of terminal parts, respectively, and
wherein a concave portion is provided in the electrically-insulating portion in a region corresponding to the embedded conductive portion.

7. The light source module according to claim 6, wherein a portion of the conductive portion embedded in the electrically-insulating portion is exposed to the outside through the concave portion.

8. The light source module according to claim 6, wherein the conductive portion comprises a pressing tab part protruding from the electrically-insulating portion to press an outer peripheral portion of the circuit board such that the circuit board is pressed against the mounting base, and
wherein the concave portion is provided at a position to expose a portion of the conductive portion near the pressing tab part to the outside.

9. The light source module according to claim 1, wherein the electrically-insulating portion is formed of an electrically-insulating material having a thermal conductivity of 5.0 to 10.0 W/m·K, and is adapted to be attached to the mounting base such that at least a portion thereof is pressed against the mounting base.

* * * * *